United States Patent
Sim et al.

(10) Patent No.: US 9,796,001 B2
(45) Date of Patent: Oct. 24, 2017

(54) APPARATUS AND METHOD FOR REMOVING PARTICLES PRESENT ON A WAFER USING PHOTOELECTRONS AND AN ELECTRIC FIELD

(71) Applicant: SK hynix Inc., Icheon (KR)

(72) Inventors: Jae Hee Sim, Cheongju (KR); Si Hyun Kim, Cheongju (KR)

(73) Assignee: SK HYNIX INC., Icheon (KR)

( * ) Notice: Subject to any disclaimer, the term of this patent is extended or adjusted under 35 U.S.C. 154(b) by 168 days.

(21) Appl. No.: 14/927,292

(22) Filed: Oct. 29, 2015

(65) Prior Publication Data

US 2016/0336196 A1 Nov. 17, 2016

(30) Foreign Application Priority Data

May 14, 2015 (KR) .................. 10-2015-0067525

(51) Int. Cl.
*B08B 6/00* (2006.01)
*H01L 21/02* (2006.01)
*H01L 21/67* (2006.01)

(52) U.S. Cl.
CPC ............ *B08B 6/00* (2013.01); *H01L 21/0209* (2013.01); *H01L 21/02057* (2013.01); *H01L 21/67028* (2013.01)

(58) Field of Classification Search
CPC .... B08B 3/04; B08B 3/12; B08B 6/00; H01L 21/02057; H01L 21/0206; H01L 21/02063; H01L 21/02065; H01L 21/0209; H01L 21/67028
See application file for complete search history.

(56) References Cited

U.S. PATENT DOCUMENTS

| | | | | |
|---|---|---|---|---|
| 5,162,969 A | * | 11/1992 | Leung | ............. B05B 5/00 347/123 |
| 5,225,000 A | * | 7/1993 | Fujii | ............. B03C 3/16 134/1 |
| 6,205,676 B1 | * | 3/2001 | Fujii | ............. B08B 6/00 134/1.3 |
| 2004/0262254 A1 | * | 12/2004 | Ozawa | ............. C23C 16/54 216/2 |
| 2011/0116705 A1 | * | 5/2011 | Heo | ............. G01N 21/9501 382/145 |
| 2015/0214027 A1 | * | 7/2015 | Tseng | ............. H01L 21/67253 134/6 |

FOREIGN PATENT DOCUMENTS

KR 10-2007-0079696 A 8/2007
KR 10-2009-0079036 A 7/2009

OTHER PUBLICATIONS

Kikuo Okuyama, "3.2. UV/Photoelectron Method", Visualization Tools for Research and Education in Aerosol Dynamics, as part of Washington University in St. Louis "Web Based Aerosol Sciences and Technology Educational Resources Workshop", Presented at AAAR (American Association for Aerosol Research) 27th Annual Conference, Oct. 20, 2008, pp. 1-5, http://aerosols.wusil.edu/AAARworkshop08/materials/Okuyama/index.htm.

* cited by examiner

*Primary Examiner* — David E Smith (57) ABSTRACT

A wafer processing apparatus includes a particle charger for charging particles adsorbed onto a wafer with photoelectrons emitted from an emitter metal layer and a particle remover for applying an electric field to the wafer, which removes the charged particles from the wafer.

14 Claims, 9 Drawing Sheets

APPARATUS AND METHOD FOR REMOVING PARTICLES PRESENT ON A WAFER USING PHOTOELECTRONS AND AN ELECTRIC FIELD

CROSS-REFERENCE TO RELATED APPLICATION

The present application claims priority under 35 U.S.C 119(a) to Korean Patent Application No. 10-2015-0067525, filed on May 14, 2015, in the Korean Intellectual Property Office, which is incorporated herein by reference in its entirety as set forth in full.

BACKGROUND

1. Technical Field

Various embodiments of the present disclosure relate to semiconductor technologies and, more particularly, to an apparatus and method for removing particles present on a wafer using photoelectrons and an electric field.

2. Related Art

Semiconductor technologies may include processes for forming patterns on a substrate or a wafer to integrate electronic circuits. Contaminants such as particles present on or adsorbed onto a surface of the wafer may cause process failures. Thus, the particles adsorbed onto the surface of the wafer have to be removed in order to form uniform patterns having desired features throughout the wafer.

Particles present on or adsorbed onto a wafer may cause process defects, and thus a process yield may be reduced. Accordingly, technologies for removing particles present on or adsorbed onto a wafer become more important. In particular, if particles are adsorbed onto a back-side surface of a wafer, a front-side surface of the wafer may be sloped when the wafer is loaded onto a chuck of a wafer processing apparatus. In such a case, process conditions on the front-side surface of the wafer may be different according to locations on the wafer. For example, if a patterning process is performed on a material layer that is formed on the front-side surface of the wafer whose back-side surface is contaminated with particles, non-uniform patterns may be formed on the front-side surface of the wafer because of a sloped profile of the front-side surface of the wafer due to the particles.

In an exposure step of a lithography process for transferring mask patterns of a photo mask onto a wafer, a front-side surface of the wafer loaded onto a wafer stage of exposure equipment may exhibit a sloped profile when particles exist on a back-side surface of the wafer, such that a depth of focus (DOF) may be different according to locations on the wafer. This may cause a defocus phenomenon. The defocus phenomenon may lead to a non-uniform exposure step. As a result, the uniformity of patterns formed on the front-side surface of the wafer may be degraded. Accordingly, a lot of effort has been introduced to remove particles adsorbed onto a back-side surface of a wafer prior to performing a wafer-processing process, such as an exposure step of a lithography process.

SUMMARY

Various embodiments are directed to an apparatus and method for removing particles present on or adsorbed onto a wafer using photoelectrons and an electric field.

According to an embodiment, a wafer processing apparatus includes a particle charger and a particle remover. The particle charger includes a first supporter supporting a wafer, an emitter metal layer disposed to face a surface of the wafer onto which particles are adsorbed and configured to emit photoelectrons by a photoelectric effect to charge the particles, and a light source generating light toward the emitter metal layer to induce the photoelectric effect. The particle remover includes a second supporter supporting the wafer transferred from the particle charger, an electrode plate creating an electric field applied to the wafer to detach the charged particles from the wafer, and a power supply unit connected to the electrode plate.

According to another embodiment, a wafer processing apparatus includes a particle charger, a particle remover, and a wafer processing unit. The particle charger includes a first supporter supporting a wafer, an emitter metal layer disposed to face a surface of the wafer onto which particles are adsorbed and configured to emit photoelectrons by a photoelectric effect to charge the particles, and a first light source generating light toward the emitter metal layer to induce the photoelectric effect. The particle remover includes a second supporter supporting the wafer transferred from the particle charger, an electrode plate creating an electric field applied to the wafer to detach the charged particles from the wafer, and a power supply unit connected to the electrode plate. The wafer processing unit includes a wafer stage supporting the wafer transferred from the particle remover and performing a wafer process.

According to another embodiment, a wafer lithography process includes loading a wafer on an emitter metal layer so that a backside surface of the wafer faces the emitter metal layer, irradiating a first light onto the emitter metal layer to emit photoelectrons from the emitter metal layer by a photoelectric effect and to charge particles existing on the backside surface of the wafer with the photoelectrons, applying an electric field to the wafer to remove the charged particles from the wafer, loading the wafer cleaned by removal of the charged particles onto a wafer stage, and exposing the wafer on the wafer stage.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

The terms used in the following embodiments may be terms which are selected with consideration of their functions in the embodiments, and the meanings of the terms may be different according to the user's intention or the customs in the art. The terms used herein should be interpreted as being defined if the terms are defined in the specification. Unless otherwise defined, all terms (including technical and scientific terms) used herein have the same meaning as commonly understood by one of ordinary skill in the art to which the present disclosure belongs.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

Same reference numerals refer to same elements through the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 1:
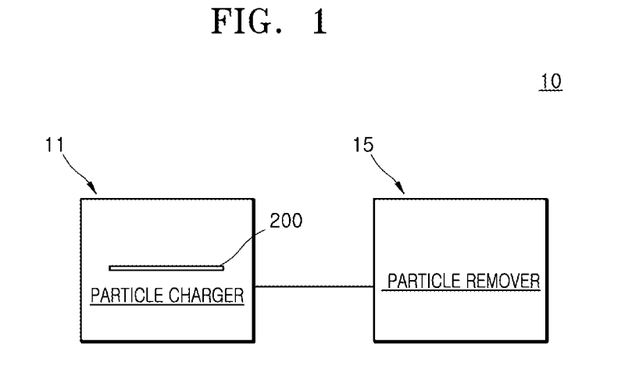
FIG. 1 is a schematic view illustrating a particle-removing unit of a wafer processing apparatus according to an embodiment.

FIG. 1 is a schematic view illustrating a particle-removing unit 10 of a wafer processing apparatus according to an embodiment. The particle-removing unit 10 may be configured to remove contaminants such as particles present on or adsorbed onto a surface of a wafer 200 without using chemicals or compulsory physical forces.

The particle-removing unit 10 may include a particle charger 11 that produces the photoelectric effect, thereby causing the emission of photoelectrons that negatively charge the particles adsorbed onto the surface of the wafer 200. The particle-removing unit 10 may further include a particle remover 15 that applies an electric field to the negatively charged particles in order to detach and remove the negatively charged particles from the surface of the wafer 200.

That is, the particles may be removed from the surface of the wafer 200 by electrically charging the particles and then applying an electric field to the electrically charged particles. Therefore, the particles may be removed even without using a physical means such as a scrubber or a chemical means such as a chemical material. As a result, secondary contamination or environmental contamination due to a physical contact or a chemical reaction may be prevented.

The particle remover 15 may be disposed adjacent to the particle charger 11, and the wafer 200 onto which the electrically charged particles are adsorbed may be transferred from the particle charger 11 into the particle remover 15. The particle charger 11 and the particle remover 15 may be disposed side-by-side in a housing (not shown) of the wafer processing apparatus, and may be spatially separated from each other. That is, the particle charger 11 and the particle remover 15 may be disposed such that a space in the particle charger 11 is separate from a space in the particle remover 15. Thus, an internal region of the particle charger 11 may not be re-contaminated by the particles detached from the wafer 200 in the particle remover 15.

Figure 2:
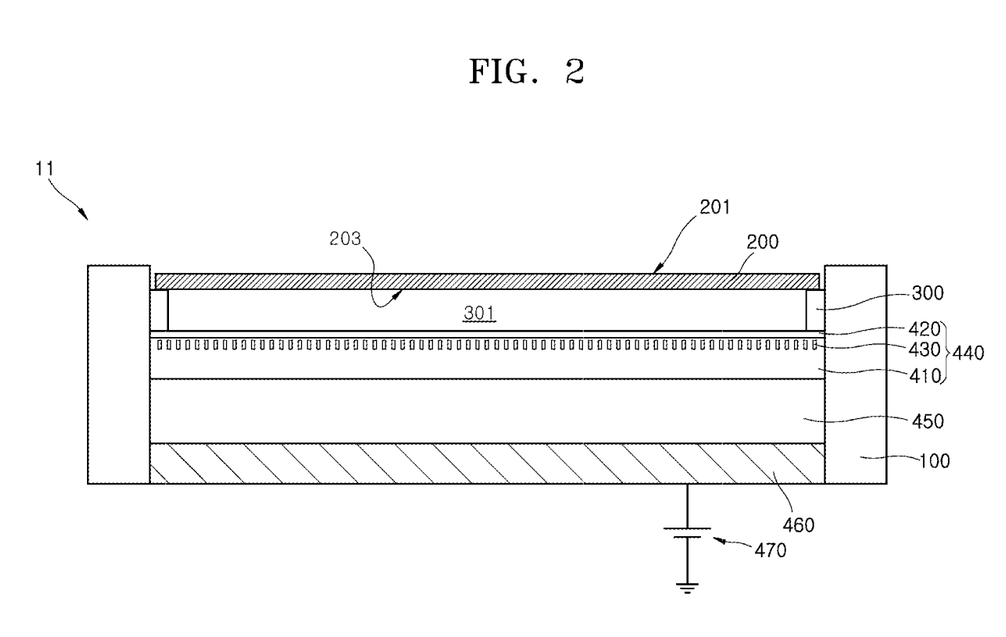
FIG. 2 is a cross-sectional view illustrating a particle charger of the particle-removing unit shown in FIG. 1 according to an embodiment.
Figure 3:
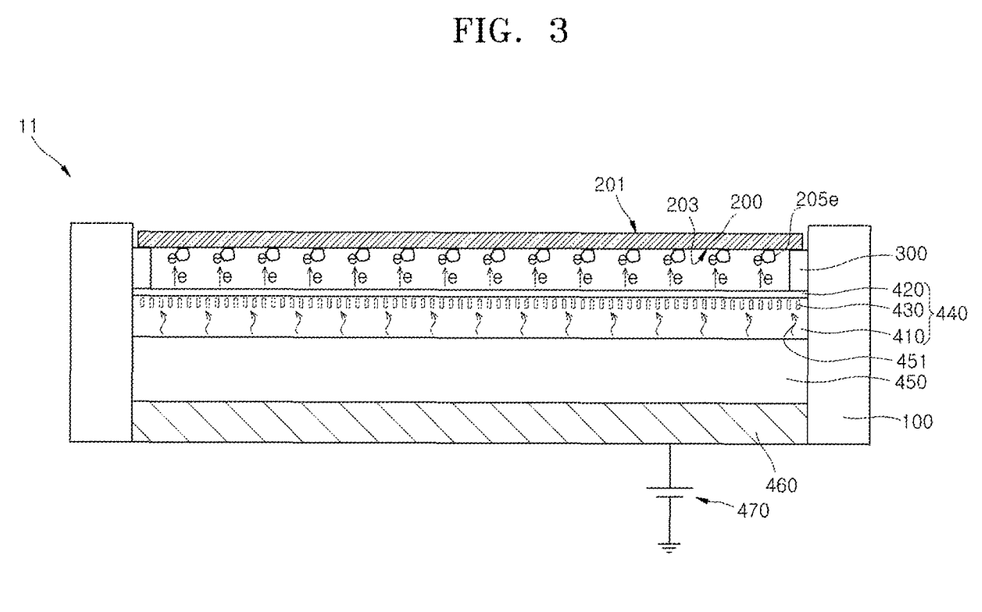
FIGS. 3, 4 and 5 are schematic views illustrating an operation of the particle charger shown in FIG. 2.
Figure 4:
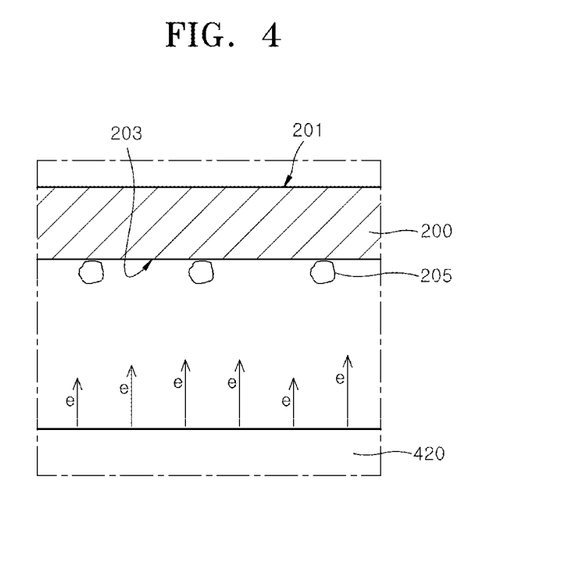
Figure 5:
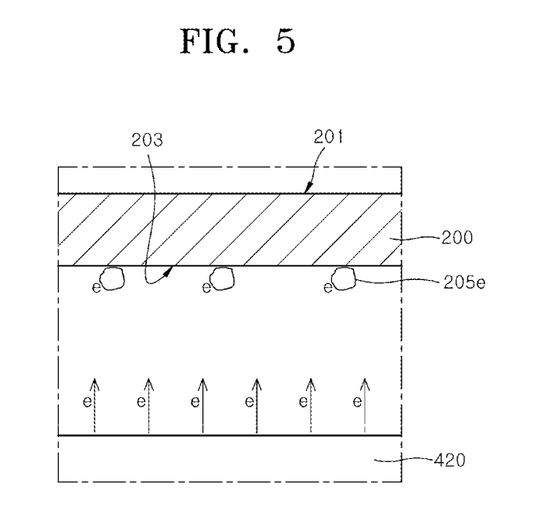

FIG. 2 is a cross-sectional view illustrating the particle charger 11 of the particle-removing unit 10 shown in FIG. 1 according to an embodiment, and FIGS. 3, 4 and 5 are schematic views illustrating an operation of the particle charger 11 shown in FIG. 2.

Referring to FIGS. 1 and 2, the particle charger 11 may include a member that emits photoelectrons toward the wafer 200 via the photoelectric effect. The particle charger 11 may include a first supporter 300 that is disposed in a first housing 100 and 460, which supports the wafer 200. The first housing 100 and 460 may provide a space in which other components of the particle charger 11 are installed. The first housing 100 and 460 may include a bottom member 460 and sidewall members 100, and the other components of the particle charger 11 may be installed in a space that is surrounded by the bottom member 460 and the sidewall members 100.

The wafer 200 may have a front-side surface 201 and a back-side surface 203 that are opposite to each other. Most wafer-processing processes for fabricating devices may be applied to the front-side surface 201 of the wafer 200. Thus, the first supporter 300 may contact edges of the back-side surface 203 of the wafer 200. The first supporter 300 may be a pin-shaped supporter or a rim-shaped supporter.

The particle charger 11 may further include a photoelectron emitter 440 including an emitter metal layer 420. The emitter metal layer 420 may face the back-side surface 203 of the wafer 200. The photoelectron emitter 440 may be located under the wafer 200 such that an empty space 301 is provided between the emitter metal layer 420 and the back-side surface 203 of the wafer 200. The first supporter 300 may support the wafer 200 such that the wafer 200 is spaced apart from the emitter metal layer 420 by a certain distance in order to provide the empty space 301.

The photoelectron emitter 440 may further include a transparent member 410 over which the emitter metal layer 420 is stacked and a plurality of transparent electrodes 430 arrayed between the emitter metal layer 420 and the transparent member 410.

A first light source 450 may be disposed under the photoelectron emitter 440. The first light source 450 may generate a light that irradiates the photoelectron emitter 440 and induces the photoelectric effect. The light generated from the first light source 450 may travel toward the emitter metal layer 420, and thus photoelectrons may be emitted from the emitter metal layer 420 via the photoelectric effect.

In an embodiment, the first light source 450 may generate ultraviolet (UV) rays that are capable of causing the photoelectric effect. In an embodiment, the first light source 450 may include a UV lamp. Although not shown in the drawings, if the first light source 450 includes a UV lamp, the particle charger 11 may further include a first power supply unit 470 connected to the UV lamp, which supplies electric power to the UV lamp.

The light generated from the first light source 450 may pass through the transparent member 410, which may include a glass layer. The transparent member 410 may act as a base member supporting the emitter metal layer 420. The emitter metal layer 420 adhered to or deposited on a surface of the transparent member 410 may emit photoelectrons via the photoelectric effect. In an embodiment, the emitter metal layer 420 may include a gold (Au) layer which efficiently emits photoelectrons via the photoelectric effect.

The transparent electrodes 430 may be arrayed at an interface between the emitter metal layer 420 and the transparent member 410. The transparent electrodes 430 may be attached to a surface of the transparent member 410 or may be embedded in the transparent member 410. Each of the transparent electrodes 430 may include a transparent conductive material such as an indium tin oxide (ITO) material. The transparent electrodes 430 may concentrate the light generated from the first light source 450 on the emitter metal layer 420 to enhance the photoelectric effect. Each of the transparent electrodes 430 may have a slit shape in a plan view. The transparent electrodes 430 may be negatively charged by trapping photoelectrons emitted from the emitter metal layer 420 via the photoelectric effect.

Since the transparent electrodes 430 are negatively charged by the photoelectrons emitted from the emitter metal layer 420, positive charges induced by the emission of the photoelectrons may gather at a surface of the emitter metal layer 420 adjacent to the transparent electrodes 430, thereby expediting the emission of photoelectrons from the emitter metal layer 420 toward the wafer 200.

The transparent electrodes 430 may be embedded in the transparent member 410 such that the transparent electrodes 430 are spaced apart from the emitter metal layer 420. The transparent member 410 may include a dielectric material. The transparent electrodes 430 may be negatively charged when photoelectrons are emitted from the emitter metal layer 420.

Referring to FIGS. 3, 4 and 5, if a first light 451 is generated from the first light source 450, the first light 451 may irradiate the emitter metal layer 420 through the transparent member 410. The first light 451 irradiating the emitter metal layer 420 may cause the photoelectrons 'e' to be emitted from a surface of the emitter metal layer 420 via the photoelectric effect. The photoelectrons 'e' emitted from the emitter metal layer 420 may move toward the back-side surface 203 of the wafer 200 and charge particles 205 of FIG. 4 adsorbed onto the back-side surface 203 of the wafer 200. As a result, the particles 205 may be negatively charged, and may become charged particles 205e of FIG. 5.

Meanwhile, when a back-side surface of a wafer is cleaned using a scrubber or a chemical material, fine particles may still exist on the back-side surface of the wafer even after the cleaning process. That is, contaminants such as particles may be removed from the back-side surface of the wafer using scrubbing equipment or chemical cleaning equipment before the wafer is transferred into a wafer processing apparatus. Nevertheless, some of the particles may still remain on the back-side surface of the wafer, or particles may be additionally adsorbed onto the back-side surface of the wafer while the cleaned wafer is transferred into the wafer processing apparatus.

To address this issue, according to the embodiment, the particles 205 may be negatively charged by the particle charger 11 to become the charged particles 205e. The wafer 200 including the charged particles 205e may be transferred into the particle remover 15 of FIG. 1, and the charged particles 205e may be removed from the wafer 200 in the particle remover 15 using an electric field. A transfer member (not shown) for moving the wafer 200 to the particle remover 15 may be disposed in the particle-removing unit 10 of FIG. 1. The transfer member may be a robot arm.

Figure 6:
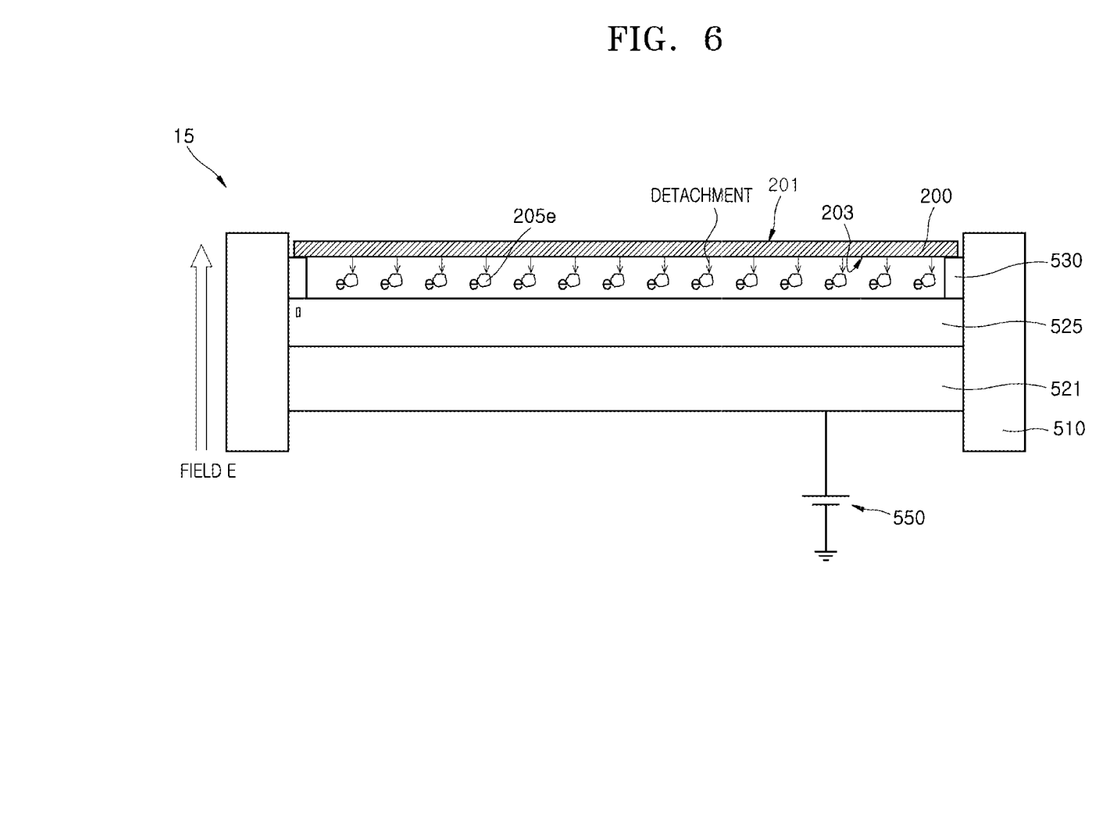
FIG. 6 is a cross-sectional view illustrating a particle remover of the particle-removing unit shown in FIG. 1 according to an embodiment.

FIG. 6 is a cross-sectional view illustrating the particle remover 15 of the particle-removing unit 10 shown in FIG. 1 according to an embodiment.

Referring to FIGS. 1 and 6, the particle remover 15 may be disposed adjacent to the particle charger 11, and the wafer 200, including the negatively charged particles 205e adsorbed onto the back-side surface 203 of the wafer 200, may be transferred from the particle charger 11 into the particle remover 15. The particle remover 15 may include a second housing 510 in which a second supporter 530 for supporting the wafer 200 is installed. The second housing 510 may provide a space which is separate from an internal space of the particle charger 11 disposed in the particle-removing unit 10 shown in FIG. 1.

The second supporter 530 may contact edges of the back-side surface 203 of the wafer 200 to support the wafer 200. The second supporter 530 may be a pin-shaped supporter or a rim-shaped supporter.

An electrode plate 521 may face the back-side surface 203 of the wafer 200, which is placed on the second supporter 530, and a second power supply unit 550 may be connected to the electrode plate 521. A dielectric layer 525 may be disposed on the electrode plate 521. The second power supply unit 550 may supply a positive voltage to the electrode plate 521 so that the electrode plate 521 functions as a positive electrode such as an anode.

The second power supply unit 550 may be a direct current (DC) voltage source. The second power supply unit 550 may produce an electric field 'E' applied to the wafer 200. The negatively charged particles 205e adsorbed onto the back-side surface 203 of the wafer 200 may be moved toward the electrode plate 521 by the electric field 'E.' That is, the negatively charged particles 205e may be detached from the back-side surface 203 of the wafer 200 by an electric force which is provided by the electric field 'E.' As a result, the negatively charged particles 205e may be removed from the wafer 200.

The particle-removing unit 10 of FIG. 1 may negatively charge the particles 205 of FIG. 4 and may remove the negatively charged particles 205e of FIG. 6 from the wafer 200 by using the electric field 'E' applied to the wafer 200. Since the particle-removing unit 10 of FIG. 1 removes the particles 205 adsorbed onto the wafer 200 by negatively charging the particles 205 with photoelectrons and by applying the electric field 'E' to the wafer 200, the particles 205 may be removed even without using scrubbing equipment or chemical cleaning equipment. That is, the particles 205 may be removed even without using a physical force or a chemical reaction. Thus, secondary contamination of the wafer 200 due to a physical force or a chemical reaction may be precluded.

Accordingly, if the particle-removing unit 10 of FIG. 1 is installed and connected to a wafer-processing unit, inside of which a wafer-processing process is performed, particles adsorbed onto a wafer may be efficiently removed before the wafer is transferred to the wafer-processing unit. According to the embodiment, since particles may be removed from a wafer by charging the particles, even fine particles having a diameter of about 1 micrometer or less can be easily removed.

Figure 7:
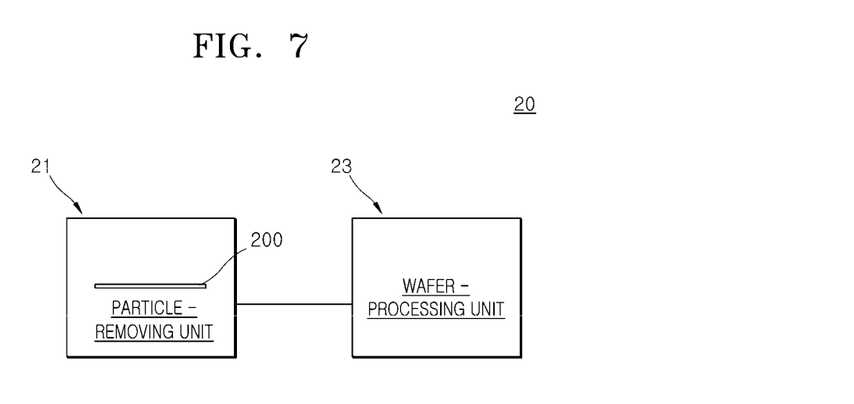
FIG. 7 is a schematic view illustrating a wafer processing apparatus according to an embodiment.
Figure 8:
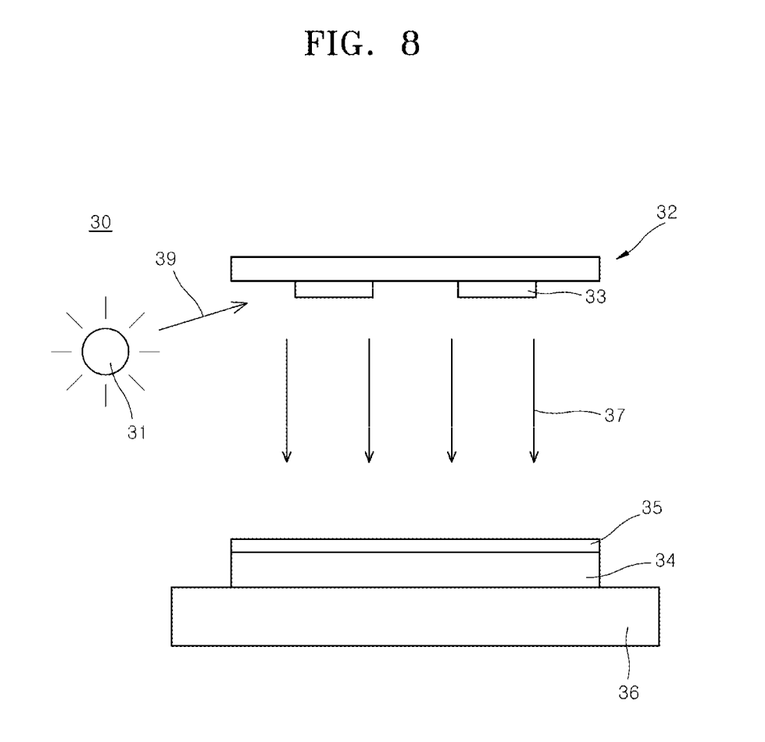
FIG. 8 is a schematic view illustrating an example of the wafer processing apparatus shown in FIG. 7.

FIG. 7 is a schematic view illustrating a wafer processing apparatus 20 according to an embodiment, and FIG. 8 is a schematic view illustrating exposure equipment 30, which is an example of a wafer-processing unit in the wafer processing apparatus 20 shown in FIG. 7.

Referring to FIG. 7, the wafer processing apparatus 20 may include a wafer-processing unit 23 performing a wafer-processing process and a particle-removing unit 21 disposed at a front end of the wafer-processing unit 23 or connected to a track that transfers a wafer 200 to the wafer-processing unit 23. Since the particle-removing unit 21 removes particles present on or adsorbed onto the wafer 200 before the wafer 200 is transferred to the wafer-processing unit 23, it is possible to prevent process defects or process failures from being generated by the particles.

The particle-removing unit 21 may have substantially the same configuration as that of the particle-removing unit 10 in FIG. 1. That is, the particle-removing unit 21 may include components corresponding to the particle charger 11 and the particle remover 15 described with reference to FIG. 1. As described above with reference to FIGS. 2 to 5, the particle charger 11 may include the first supporter 300 that supports the wafer 200 and the emitter metal layer 420 that faces the back-side surface 203 of the wafer 200 onto which the particles 205 are adsorbed. The emitter metal layer 420 may emit the photoelectrons 'e' of FIG. 3, via the photoelectric effect, which negatively charge the particles 205. The particle charger 11 may further include the first light source 450 generating a first light that travels toward the emitter metal layer 420 and induces the photoelectric effect.

As described above with reference to FIG. 6, the particle remover 15 may include the second supporter 530 supporting the wafer 200 transferred from the particle charger 11, the electrode plate 521 applying an electric field to the wafer 200 that detaches the negatively charged particles 205e from the wafer 200, and the second power supply unit 550 connected to the electrode plate 521.

The particle-removing unit 21 including the components corresponding to the particle charger 11 and the particle remover 15 may be connected to the wafer-processing unit 23 and may remove the particles 205 adsorbed onto the wafer 200 before the wafer 200 is transferred to the wafer-processing unit 23. Thus, the wafer-processing unit 23 can receive the wafer 200 that has been cleaned by removing the particles 205, and perform a wafer-processing process without process defects or process failures that could be caused by the particles 205. The wafer-processing unit 23 may include equipment in which a process for forming patterns on the wafer 200 is performed. In some embodiments, the wafer-processing unit 23 may include exposure equipment, deposition equipment, or etching equipment.

Referring to FIGS. 7 and 8, the wafer-processing unit 23 shown in FIG. 7 may be exposure equipment 30 that performs an exposure step of a lithography process. The exposure equipment 30 may include a wafer stage 36 on which a wafer 34 (corresponding to the wafer 200 of FIG. 7) is loaded. Since the wafer 34 is transferred to the exposure equipment 30 after particles adsorbed onto the wafer 34 are removed from the wafer 34, no particles may exist between the wafer 34 and the wafer stage 36. Thus, a top surface of the wafer 34 loaded onto the wafer stage 36 may maintain a horizontal level without a sloped profile. As a result, when a resist layer 35 is coated on the wafer 34, a top surface of the resist layer 35 may have a uniform height. Accordingly, when the resist layer 35 is exposed to an image light 37 provided from a photo mask 32, a defocus phenomenon may not occur.

The exposure equipment 30 may further include a second light source 31 generating a second light 39. The photo mask 32 having mask patterns 33 may be loaded into the exposure equipment 30. The mask patterns 33 may provide the image light 37 when the second light 39 irradiates the photo mask 32. The photo mask 32 may be a reflective mask or a transmitting mask. If the photo mask 32 is a reflective mask, the second light source 31 may be a light source generating an extreme ultraviolet (EUV) ray. Alternatively, if the photo mask 32 is a transmitting mask, the second light source 31 may be a light source generating an argon fluoride (ArF) laser beam.

Figure 9:
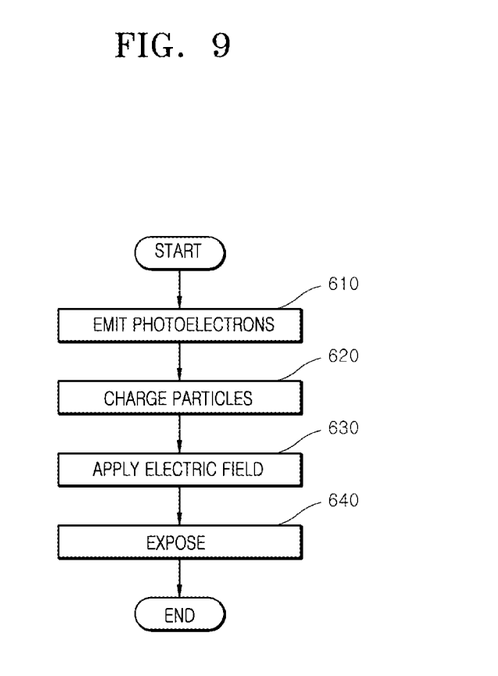
FIG. 9 is a process flowchart illustrating a particle-removing process according to an embodiment.

FIG. 9 is a flowchart illustrating an exposure process of a lithography process according to an embodiment.

Referring to FIG. 9, the exposure process may include emitting photoelectrons (step 610), charging particles adsorbed onto a wafer with the emitted photoelectrons (step 620), and applying an electric field to the wafer, which removes the charged particles from the wafer (step 630), and exposing the wafer cleaned with removal of the particles to a light (see a step 640). The wafer cleaned through the particle-removing process may be loaded into a wafer-processing unit.

Specifically, referring to FIGS. 1 through 8, the wafer 200 of FIG. 2 may be first loaded into the particle charger 11 of FIG. 1 of the particle-removing unit 10 of FIG. 1 so that the back-side surface 203 of the wafer 200 faces a top surface of the emitter metal layer 420 of FIG. 2.

After that, the first light 451 of FIG. 3 generated by the first light source 450 of FIG. 3 may irradiate the emitter metal layer 420, causing photoelectrons 'e' of FIG. 3 to be emitted toward the wafer 200 via the photoelectric effect (step 610). The photoelectrons 'e' may charge the particles 205, such that the particles 205 become the negatively charged particles 205e (step 620). The wafer 200 including the negatively charged particles 205e may be transferred into the particle remover 15 of FIG. 1, and the electric field E of FIG. 6 may be created so that a positive voltage is induced at the electrode plate 521 of FIG. 6 (step 630). As a result, the electric field E may detach and remove the negatively charged particles 205e from the wafer. After that, the wafer 200, which has been cleaned by the removing process of the negatively charged particles 205e, may be loaded onto the wafer stage 36 of FIG. 8 of the exposure equipment 30 of FIG. 8 and may be subject to an exposure process. The particle-removing process described above may prevent a defocus phenomenon in exposure process and thus remarkably reduce exposure failures.

According to embodiments, a particle-removing unit for removing particles from a wafer and a wafer processing apparatus including the same may be provided. The particle-removing unit may remove particles from a back-side surface of the wafer before the wafer is loaded onto a wafer stage of, e.g., exposure equipment. As a result, occurrence of a defocus phenomenon may be prevented while an exposure process is performed on the wafer in the exposure equipment.

The wafer processing apparatuses according to the aforementioned embodiments and the processes performed by the same may be used to fabricate integrated circuit (IC) chips. The IC chips may be supplied in a raw wafer form, in a bare die form, or in a package form. The IC chips may also be supplied in a single package form or in a multi-chip package form. The IC chips may be integrated into intermediate products such as mother boards or in end products. The end products may include toys, low-end application products, or high-end application products such as computers. For example, the end products may include display units, keyboards, or central processing units (CPUs).

Although embodiments of the present disclosure have been described for illustrative purposes, those skilled in the art will appreciate that various modifications, additions and substitutions are possible, without departing from the scope and spirit of the present invention as defined in the accompanying claims.

What is claimed is:
1. A wafer processing apparatus, comprising:
  a particle charger charging particles adsorbed onto a surface of a wafer with photoelectrons emitted via the photoelectric effect; and
  a particle remover applying an electric field to the wafer transferred from the particle charger, the electric field removing the charged particles from the wafer,
  wherein the particle charger comprises:
    a first supporter supporting a wafer;
    an emitter metal layer emitting the photoelectrons via the photoelectric effect such that the particles adsorbed onto the surface of the wafer are charged with the photoelectrons;

a light source generating a light toward the emitter metal layer to induce the photoelectric effect; and a transparent member disposed between the light source and the emitter metal layer such that the light generated from the light source reaches the emitter metal layer through the transparent member, wherein the transparent member supports the emitter metal layer such that a top surface of the emitter metal layer faces a back-side surface of the wafer.

2. The apparatus of claim 1, wherein the particle charger is separate from the particle remover.

3. The apparatus of claim 1, wherein the particle remover comprises:

a second supporter supporting the wafer transferred from the particle charger;

an electrode plate generating the electric field applied to the wafer transferred from the particle charger so that the charged particles are detached from the wafer; and a power supply unit supplying power to the electrode plate.

4. The apparatus of claim 1, wherein the wafer is loaded into the particle charger and spaced apart from the emitter metal layer by a certain distance.

5. The apparatus of claim 1, wherein the particle charger further comprises an array of transparent electrodes disposed between the emitter metal layer and the transparent member.

6. The apparatus of claim 5, wherein the transparent electrodes trap photoelectrons emitted from the emitter metal layer toward the light source; and wherein each of the transparent electrodes has a slit shape that concentrates the light generated from the light source on the emitter metal layer.

7. The apparatus of claim 1, wherein the transparent member includes a glass layer.

8. The apparatus of claim 1, wherein the emitter metal layer includes a gold layer.

9. The apparatus of claim 1, wherein the light source includes an ultraviolet (UV) lamp.

10. The apparatus of claim 3, wherein the power supply unit supplies a direct current (DC) voltage such that the electrode plate has a positive voltage.

11. The apparatus of claim 1, wherein the particle remover is disposed adjacent to the particle charger, the particle remover receiving the wafer having the charged particles.

12. The apparatus of claim 1, further comprising:

a wafer-processing unit including a wafer stage supporting the wafer transferred from the particle remover, the wafer-processing unit performing a wafer-processing process on the wafer.

13. The apparatus of claim 12, wherein the wafer-processing unit is disposed adjacent to the particle remover and receives the wafer from which the charged particles are removed.

14. The apparatus of claim 12, wherein the wafer-processing unit further includes:

a light source generating an exposure light that irradiates a photo mask to produce a pattern image transferred on the wafer from which the charged particles are removed.

* * * * *